United States Patent [19]

Herwig et al.

[11] 4,379,834

[45] Apr. 12, 1983

[54] PROCESS FOR CLEANING COPPER-CONTAINING METAL SURFACES

[75] Inventors: Walter Herwig, Bad Soden; Kurt Klüpfel, Wiesbaden; Helga Sikora, Wiesbaden; Heide Sprengel, Wiesbaden, all of Fed. Rep. of Germany

[73] Assignee: Hoechst Aktiengesellschaft, Fed. Rep. of Germany

[21] Appl. No.: 391,084

[22] Filed: Jun. 23, 1982

Related U.S. Application Data

[60] Continuation of Ser. No. 270,052, Jun. 3, 1981, abandoned, which is a division of Ser. No. 93,114, Nov. 13, 1979, abandoned.

[30] Foreign Application Priority Data

Nov. 17, 1978 [DE] Fed. Rep. of Germany ....... 2849894

[51] Int. Cl.$^3$ ................................................ G03C 5/24
[52] U.S. Cl. ........................................ 430/329; 134/2; 134/3; 204/15; 427/98; 427/327; 430/331
[58] Field of Search ............... 430/329, 331; 252/142; 134/2, 3; 427/327, 98; 204/15

[56] References Cited

U.S. PATENT DOCUMENTS

| 3,030,238 | 4/1962 | Cohn et al. | 134/26 |
| 3,166,444 | 1/1965 | Ehren et al. | 427/327 |
| 3,847,663 | 11/1974 | Shumaker | 134/2 |
| 3,915,633 | 10/1975 | Ramachandkan | 252/142 |
| 3,930,865 | 1/1976 | Faust et al. | |
| 4,046,620 | 9/1977 | Andrascek et al. | 427/327 |
| 4,088,498 | 5/1978 | Faust | |
| 4,165,295 | 8/1979 | Vander Mey | 134/3 |

FOREIGN PATENT DOCUMENTS

| 2364162 | 7/1974 | Fed. Rep. of Germany | 134/3 |
| 1066407 | 4/1967 | United Kingdom | |
| 1256710 | 12/1971 | United Kingdom | |
| 1296123 | 11/1972 | United Kingdom | |
| 1530288 | 10/1978 | United Kingdom | |

*Primary Examiner*—John D. Smith
*Attorney, Agent, or Firm*—James E. Bryan

[57] ABSTRACT

A process and an aqueous treatment solution for cleaning copper surfaces, in particular for removing residues of photoresist layers, which residues still adhere after development to the cleared copper areas, are described. The solution contains a water-soluble aliphatic sulfonic acid having 8 to 30 carbon atoms or a water-soluble salt thereof.

9 Claims, No Drawings

PROCESS FOR CLEANING COPPER-CONTAINING METAL SURFACES

This is a continuation, of application Ser. No. 270,052, filed June 3, 1981 now abandoned, in turn a division of Ser. No. 093,114, filed Nov. 13, 1979, and now abandoned.

The invention relates to a process for cleaning copper-containing metal surfaces, in particular prior to the deposition of metals by electroplating on these surfaces.

In the manufacture of printed circuit boards by the photoresist process, a resist stencil is produced on the surface, on which electroplated printed circuit tracks are to be deposited, by applying a photoresist layer, exposing and developing. The metal surface which is thus cleared imagewise and which normally consists of copper or of a copper alloy, must be carefully cleaned before electroplating in order to obtain good adhesion and homogeneity of the printed circuit tracks deposited. This can be achieved only with difficulty if the printed circuit tracks are very fine and are located between stripes of resist at a distance of only a few $\mu$m. In every case, it is necessary to subject the metal surface, which has been cleared after development, to intensive cleaning in at least one treatment step, it being intended, above all, to completely remove any residual resist which still adheres.

Cleaning agents for metal surfaces which, if appropriate, are to be electroplated afterwards, are described, for example, in British Pat. No. 1,066,407. In this publication, combinations of nonionic wetting agents with fatty acids and alkanolamines are used.

German Pat. No. 1,958,875 describes a washing fluid for cleaning the surface of printed circuits in order to remove residual resin, which has remained after soldering. The fluid consists of a mixture of toluene, butyl acetate and isopropanol.

In U.S. Pat. No. 3,030,238, aqueous solutions of polyglycol ether condensation products, alkylarylsulfonates or certain ammonium compounds are described as cleaning agents for metal surfaces.

U.S. Pat. No. 3,847,663, describes cleaning agents for metal surfaces, which cleaning agents contain metal silicates, metal chlorides, non-ionic wetting agents and chelate-forming agents.

All these agents are not intended for selective cleaning, during which all layer residues are removed from the areas cleared by development, while the cured layer zones on the covered areas of the metal are to remain free from attack. Accordingly, these agents are suitable for this purpose only to a limited extent or not at all. Many agents of this type are disadvantageous because of their high content of organic solvents and can be used only with special precautionary measures.

To clean metal surfaces which have been covered imagewise by the photoresist method, the metal surface was hitherto pre-etched, for example with ammonium peroxidisulfate, and then treated for a short period with sulfuric acid, as is described, for example, in British Pat. No. 1,530,288, Example 1. With pre-etching of sufficient duration, a clean surface is finally obtained, but there is a risk of thin copper layers being etched through if the pre-etching is unduly extensive.

These problems arise in particular when photoresist materials are used which have a particularly good adhesion to the metal. This property, which is very desirable for a high resistance of the image stencil to electroplating baths, is obtained, for example, by the addition of certain adhesion promoters, as is described in the German Offenlegungsschrift mentioned above.

It is therefore the object of the invention to provide a cleaning process for copper-containing metal surfaces, in particular surfaces which are contaminated by fogs of photoresist, which process permits complete cleaning under conditions which do not pollute the environment, and without excessive ablation of the metal which is to be cleaned.

The starting point of the invention is a process for cleaning copper-containing metal surfaces by a treatment with an aqueous solution of an aliphatic compound.

The process according to the invention comprises treating the surface with a solution which contains a water-soluble aliphatic sulfonic acid, or a water-soluble salt of such a sulfonic acid, having 8 to 30 carbon atoms.

The process is quite effective for the removal of organic impurities from metal surfaces. It is therefore applicable in all cases where a clean surface which is free from organic, in particular high-molecular weight, impurities is required. Mainly, this is the case whenever a further, firmly adhering metal layer is to be deposited on the metal by electroplating or electrolessplating.

The preferred use of the cleaning process is in the manufacture of printed circuit boards, for example copied circuit diagrams, by the photoresist method. The photo-stencil here can be produced either with positive-working photoresist materials, for example materials based on o-naphthoquinone diazides, or with negative-working photoresist layers. Preferably, negative-working layers, i.e. light-curable layers, are used, for example those composed of substances which can be cross-linked by light, such as polyvinyl cinnamates, p-quinone-diazides, azido compounds, if appropriate combined with polymers which can be cross-linked, or of photopolymerization mixtures.

In this case, the light-sensitive layer is applied to a metal foil, preferably of copper, which is laminated to an insulating board, by coating from a solution or by lamination of a prefabricated solid layer. The light-sensitive layer is exposed under an original, for example a circuit diagram, the image areas, on which the printed circuit tracks are eventually to be located, are developed by washing out and the cleared metal areas are pre-etched, if appropriate. A metal which can differ from the base metal is then deposited on these metal areas, by electroless or preferably by electroplating. The resist stencil is then removed in the customary manner, for example by means of solvents or mechanically, and the relatively thin metal layer is finally etched off of the areas which previously had been covered by the stencil.

In the course of the manufacture of printed circuit boards, described here, the cleaning process according to the invention is applied at a suitable point in time after the image exposure and before electroplating. Essentially two alternatives are possible here: the salt of the sulfonic acid already can be added to the developer solution, or this can be made to act in the form of an aqueous cleaning solution after development. It is also possible, and advantageous in some cases, to use the cleaning agent both as an additive to the developer and in the form of a further treatment solution.

The water-soluble sulfonic acids or sulfonic acid salts, used as cleaning agents in the process according to the invention, are known. Suitable examples are described in British Pat. Nos. 1,296,123, 1,256,710. The compounds can contain one or more, preferably one, sulfonic acid group in the molecule. They are derived from saturated or unsaturated aliphatic hydrocarbons which, preferably, do not contain more than one double bond in the molecule. In addition to the sulfonic acid group, the compounds can contain other substituents, such as halogen atoms, alkoxy groups and preferably hydroxyl groups. The hydrocarbon chain can be branched or unbranched. Unbranched compounds are particularly readily accessible and biodegradable, and are therefore preferred. In general, the chain length is 8 to 30, preferably 10 to 22, carbon atoms. In the case of mixtures of homologs of different chain lengths, this means the mean number of carbon atoms. If the compounds are present as water-soluble salts, these can be in particular the alkali metal salts, ammonium salts and alkaline earth metal salts. The alkali metal salts, in particular the sodium salts and potassium salts, are in general preferred because of their high solubility in water.

Examples of suitable sulfonic acids, which can also be used in the form of their sodium, potassium, calcium or magnesium salts, are:

2-hydroxy-hexadecane-1-sulfonic acid,
hexadecane sulfonic acid,
2-hydroxy-tetradecane-1-sulfonic acid,
$C_{14}$-$C_{16}$-olefinsulfonic acid,
2-hydroxy-n-alkane-($C_{12}$-$C_{14}$)-sulfonic acid, and
alkene-($C_{15}$-$C_{18}$)-disulfonic acid.

The concentration of the cleaning agent in the aqueous solution is in general in the range from 0.05 to 15, preferably between 0.1 and 10, percent by weight. If the agent, as mentioned above, is used as a component of the developer solution, concentrations of about 0.1 to 5% by weight are preferred. If it is used in the form of a separate treatment solution, higher concentrations, for example in the range from 1 to 8% by weight, are preferred in most cases.

If the sulfonic acid or salt thereof is not used in an alkaline solution, its activity can be enhanced by the addition of a mineral acid or a carboxylic acid. Suitable mineral acids are those which do not attack the resist stencil, for example sulfuric acid or phosphoric acid. Phosphoric acid is particularly preferred. Preferred carboxylic acids are non-volatile carboxylic acids, in particular those having at least two carboxyl groups. The acid can be added in quantities from 0.5 to 30, preferably from 2 to 15, percent by weight.

Furthermore, small amounts of water-miscible organic solvents, for example aliphatic alcohols having 1 to 5 carbon atoms or glycol half-ethers of these alcohols, can be added to the cleaning solution or to the developer. Normally, less than 20% by weight, preferably not more than 5% by weight, of these are added.

If the solution containing the sulfonic acids or the salts thereof tends to foam, small amounts of commercially available anti-foaming agents also can be added in known manner.

The action of the cleaning solution ordinarily takes place at room temperature; in some cases, the activity can be enhanced by raising the temperature, approximately up to 60° C. The time of action can differ widely, depending upon the nature of the resist layer, the concentration and the temperature of the solution, and also as a function of further cleaning steps, such as pre-etching. In general, it is between 20 seconds and 10 minutes. In most cases, times of about 1-3 minutes are sufficient.

The application can be effected by dipping, spraying or in other suitable manner.

Possible metals which may be subjected to the cleaning process according to the invention are, above all, copper and copper alloys having a copper content of at least 30% by weight. Other metals, such as aluminum, nickel, chromium, steel and the like, also can be cleaned by this process.

The resist layers used are, as mentioned above, light-curable, in particular photopolymerizable, layers which contain, as the essential constituents, polymeric binders, compounds which can be polymerized by a free radical mechanism, in particular acrylic or methacrylic acid esters, having at least two ethylenically unsaturated groups in the molecule, and photoinitiators. Suitable photopolymerizable materials are described in U.S. Pat. Nos. 4,088,498 and 3,930,865, British Pat. No. 1,530,288 and U.S. Pat. No. 4,233,395. The process according to the invention is particularly effective in the case of those materials which contain adhesion promoters in order to improve the adhesion to copper and hence to increase the resistance of the stencil to aggressive electroplating baths. In general, those materials also are preferred which can be developed with aqueous-alkaline solutions. Suitable developers are solutions of alkaline salts, such as silicates, phosphates, borates or carbonates of the alkali metals, which solutions also can contain small amounts of organic solvents, if appropriate.

After development, the cleared metal surface is treated with an aqueous cleaning solution by the process according to the invention, if this has not been already effected by the developer solution. After this treatment, the metal surface can be pre-etched in known manner, for example using an oxidizing agent. When the process according to the invention is used, this etching step can be carried out in a substantially shorter time and hence with less attack on the metal foil. The desired electroplating then follows in known manner.

The result of the invention is that so-called resist fogs and other organic impurities are removed completely and in a gentle manner from the metal surface. The metal tracks deposited by electroplating on the cleaned metal surfaces adhere very firmly to the base metal, even if they are of very small width, and are not removed from the metal either during the removal of the cured resist stencil (stripping) or as the result of other mechanical stresses.

The examples which follow illustrate preferred embodiments of the process according to the invention. Quantitative ratios and percentage figures are weight units, unless otherwise stated. The quantities of the layer constituents are given in parts by weight (p.b.w.).

EXAMPLES 1-7

A number of dry resist materials with a photopolymerizable layer were prepared as follows: A solution of
5.6 parts by weight of the reaction product of 1 mole of 2,2,4-trimethyl-hexamethylene diisocyanate and 2 moles of 2-hydroxyethyl methacrylate,
6.5 parts by weight of a terpolymer of styrene, n-hexylmethacrylate and methacrylic acid (10:60:30) having an acid number of about 190,
0.2 part by weight of 9-phenyl-acridine,
0.015 part by weight of 4,4'-bis-dimethylamino-benzophenone,
0.15 part by weight of triethylene glycol dimethacrylate and 0.025 part by weight of a blue azo dye, obtained by coupling 2,4-dinitro-6-chlorobenzene-diazonium salt with 2-methoxy-5-acetylamino-N-cyanoethyl-N-hydroxyethylaniline in 28 parts by weight of butanone-2 is whirler-coated onto a 25 μm thick polyethylene terephthalate film. The layer then is dried for 2 minutes at 100° C. in a drying oven and is then covered with a 25 μm thick cover film. The dry layer has a thickness of 25 μm.

The copper surface of phenoplast laminate boards, laminated with a 35 μm thick copper foil and having a size of 100×150 mm, is mechanically cleaned using pumice powder or a brushing machine and, after intensive rinsing with water, is blown dry with air.

The dry resist—after the cover film has been peeled off—is laminated onto the Cu plates, pretreated in this way, with the aid of a commercially available laminator.

The samples are then exposed for 17 seconds through the support film under a negative original, using a xenon lamp of 8 kW at a lamp distance of 80 cm. The exposure mask used here is an original having parallel stripes of 30 mm length, 100 μm width and 100 μm parallel spacing.

After the support films have been peeled off, the unexposed layer areas are washed out with a developer solution. The plates developed in this way are then dipped into a cleaning bath.

The developer solution is composed of an aqueous sodium carbonate solution of 0.8% by weight. In some cases, salts of aliphatic sulfonic acids are added to this solution in order to improve the cleaning action. The corresponding data can be taken from Table 1 below. In the Table, the spraying times for development and the temperature of the developer are also indicated. Moreover, the composition, the time of action and temperature of action of the cleaning solution and the result of the experiment are listed. Example 1 is a comparative example in which an aqueous solution of a polyethylene oxide alkyl ether is used as the cleaning agent.

The developed and cleaned plate is subjected to the following further treatment:

1 minute intensive rinsing with water, 30 seconds dipping in a bath of 15% concentration ammonium persulfate solution, 45 seconds rinsing with water, 1 minute dipping in a bath of 10% concentration sulfuric acid, and 30 minutes in a copper plating bath at 2.5 A/dm², relative to the surface area which is to be copper plated, at 20°–25° C.

The copper electroplating bath used is a commercially available bath (copper PC bath—"printed circuit" bath from Messrs. Schlötter, Geislingen/Steige, Federal Republic of Germany).

After the plates have been intensively rinsed with water and carefully blown dry, the adhesion properties of the 100 μm wide copper tracks are tested after 2 hours, using a fine erasing knife. On each plate, 10 adjacent stripes of 100 μm width each are worked with the knife.

TABLE 1

| Example No. | Addition to the developer Type | Quantity, in % by weight | Spraying time, in seconds | Temperature, °C. | Cleaning Solution Constituents | Quantity, in % by weight | Dipping time, in seconds | Temperature, °C. | Adhesion Test a | b | c | d |
|---|---|---|---|---|---|---|---|---|---|---|---|---|
| 1 | — | — | 60 | 23 | TNG | 4.5 | 130 | 23 | 7 | — | + | — |
| 2 | A | 0.1 | 55 | 25 | — | — | — | — | 0 | — | — | — |
| 3 | A | 0.2 | 50 | 40 | H₃PO₄ A | 10 5 | 120 | 23 | 0 | — | — | — |
| 4 | — | — | 70 | 25 | Citric acid A | 10 5 | 120 | 23 | 0 | — | — | — |
| 5 | — | — | 70 | 25 | A | 5 | 120 | 23 | 0 | — | — | — |
| 6 | — | — | 70 | 25 | H₃PO₄ A | 10 5 | 120 | 23 | 0 | — | — | — |
| 7 | A | 0.5 | 45 | 25 | H₃PO₄ B | 10 2 | 120 | 23 | 0 | — | — | — |

TNG = Tridecyl nonaglycol ether
A = Sodium n-alkanesulfonate ($C_{13}$–$C_{18}$)
B = n-Alkanesulfonic acid ($C_{13}$–$C_{18}$)
a = number of copper tracks lifted
b = the copper tracks can be lifted off easily and completely; yes (+), no (−)
c = the copper tracks can be lifted off with diffuculty, but completely; yes (+), no (−)
d = the copper tracks can be lifted off with difficulty, and only paritally; yes (+), no (−)

EXAMPLES 8–26

Dry resist films were prepared and processed as in Example 1. The following solution was used as the coating solution:

5.6 parts by weight of the reaction product of 1 mole of hexamethylene diisocyanate and 2 moles of hydroxypropyl methacrylate, 6.5 parts by weight of a terpolymer of styrene, n-hexyl methacrylate and methacrylic acid (10:60:30) having an acid number of 185, 0.2 part by weight of 9-phenyl-acridine, 0.15 part by weight of triethylene glycol dimethacrylate, 0.015 part by weight of 4,4'-bis-dimethylamino-benzophenone, 0.025 part by weight of the blue azo dye indicated in Examples 1–7 and 0.15 part by weight of 3-mercapto-propionic acid 2,4-dichloro-anilide in 30 parts by weight of butanone.

The photopolymerizable layers were, in the same way as in Examples 1–7, transferred to copper laminate boards, exposed, developed and then, as described in Examples 1–7, aftertreated. The nature of the treatment and the results are compiled in Table 2 below. Unless explained in footnotes, the symbols have the same meaning as in Table 1. Examples 8 and 9 are comparative examples.

2 parts by weight of ethanol is applied by casting to a 25 μm thick polyethylene terephthalate film. The

TABLE 2

| Example No. | Addition to the developer Type | Quantity, in % by weight | Spraying time, in seconds | Temperature, °C. | Cleaning Solution Constituents | Quantity, in % by weight | Dipping time, in seconds | Temperature, °C. | Adhesion Test a | b | c | d |
|---|---|---|---|---|---|---|---|---|---|---|---|---|
| 8 | — | — | 60 | 23 | TNG / $H_3PO_4$ | 4.0 / 8 | 130 | 23 | 10 | + | — | — |
| 9 | — | — | 60 | 23 | $H_3PO_4$ | 10 | 40 | 25 | 10 | + | — | — |
| 10 | A | 0.2 | 45 | 25 | — | — | — | — | 0 | — | — | — |
| 11 | A | 0.1 | 55 | 25 | — | — | — | — | 0 | — | — | — |
| 12 | A | 0.2 | 50 | 40 | $H_3PO_4$ / A | 10 / 5 | 120 | 23 | 2 | — | — | + |
| 13 | — | — | 70 | 25 | B | 10 | 60 | 23 | 3 | — | — | + |
| 14 | — | — | 70 | 25 | B | 5 | 60 | 23 | 0 | — | — | — |
| 15 | — | — | 70 | 25 | $H_2SO_4$ / A | 10 / 5 | 120 | 23 | 2 | — | — | + |
| 16 | — | — | 70 | 25 | $H_3PO_4$ / A | 10 / 5 | 120 | 23 | 0 | — | — | — |
| 17 | — | — | 70 | 25 | $H_3PO_4$ / A | 10 / 5 | 120 | 50 | 0 | — | — | — |
| 18 | — | — | 70 | 25 | $H_3PO_4$ / B | 10 / 2 | 120 | 23 | 3 | — | — | + |
| 19 | A | 0.5 | 45 | 25 | $H_3PO_4$ / B | 10 / 2 | 120 | 23 | 0 | — | — | — |
| 20 | — | — | 60 | 25 | $H_3PO_4$ / A | 10 / 3 | 120 | 23 | 0 | — | — | — |
| 21 | — | — | 60 | 25 | $H_3PO_4$ / A | 8 / 4 | 120 | 23 | 0 | — | — | — |
| 22 | — | — | 60 | 25 | C | 5 | 120 | 23 | 0 | — | — | — |
| 23 | — | — | 60 | 25 | $H_3PO_4$ / C | 10 / 5 | 120 | 23 | 0 | — | — | — |
| 24 | — | — | 60 | 25 | $H_3PO_4$ / D | 10 / 5 | 120 | 23 | 0 | — | — | — |
| 25 | — | — | 60 | 25 | $H_3PO_4$ / E | 10 / 5 | 120 | 23 | 0 | — | — | — |
| 26 | — | — | 60 | 25 | $H_3PO_4$ / F | 10 / 5 | 120 | 23 | 0 | — | — | — |

Footnotes relative to Table 2:
TNG = Tridecyl nonaglycol ether
A = Sodium n-alkanesulfonate ($C_{13}-C_{18}$)
B = n-Alkanesulfonic acid ($C_{12}-C_{18}$)
C = Sodium alkenesulfonate ($C_{15}-C_{18}$)
D = Potassium alkenesulfonate ($C_{14}-C_{16}$)
E = Calcium alkenesulfonate ($C_{15}-C_{18}$)
F = Magnesium alkenesulfonate ($C_{15}-C_{18}$)
a = number of copper tracks lifted
b = the copper tracks can be lifted off easily and completely; yes (+), no (−)
c = the copper tracks can be lifted off with difficulty, but completely; yes (+), no (−)
d = the copper tracks can be lifted off with difficulty and only partially; yes (+), no (−).

EXAMPLES 27-35

A solution of
6.5 parts by weight of a terpolymer of n-hexyl methacrylate, methacrylic acid and styrene (60:30:10 parts by weight) having a mean molecular weight of about 35,000,
2.8 parts by weight of the saturated polyurethane indicated below,
2.8 parts by weight of a polymerizable polyurethane which was prepared, analogously to the saturated polyurethane, by reacting 2 moles of 2,2,4-trimethyl-hexamethylene diisocyanate with 1 mole of anhydrous triethylene glycol and further reacting the reaction product with 2 moles of hydroxyethyl methacrylate.
2.8 parts by weight of 2-ethyl-hexyl-4-hydroxy-benzoate,
0.2 part by weight of 9-phenyl-acridine,
0.1 part by weight of 3-mercapto-propionic acid 2,4-dichloro-anilide, and
0.025 part by weight of the dye "Disperse Red" (C.I. 179) in
25 parts by weight of methyl ethyl ketone and layer is dried for 3 minutes at 100° C. in a drying oven and then has a thickness of 45 μm.

Synthesis of the polyurethane 2 moles of 2,2,4-trimethyl-hexamethylene diisocyanate in 800 g of methyl ethyl ketone are initially introduced into a three-necked flask equipped with a stirrer, reflux condenser with an attached $CaCl_2$ drying tube, and a dropping funnel. After the addition of a mixture, acting as a catalyst of
1.5 g of iron-III acetylacetonate and
2.0 g of diethylcyclohexylamine in
50.0 g of methyl ethyl ketone
1 mole of anhydrous triethylene glycol, dissolved in
50 g of methyl ethyl ketone, is metered in in such a way that the reaction temperature is kept constant at 70°±1° C. For this purpose, the batch is heated by means of a water bath which initially has a temperature of 60° C. and—after the desired internal temperature has been reached as a result of the heat of the polyaddition reaction—the batch is cooled (bath temperature: about 40° to 50° C.). After the end of the addition of triethylene glycol, 2 moles of triethylene glycol monobutyl ether are added dropwise at 70° C. After the end of the reaction, the solution is stirred for an additional 2 hours at 70° C. and then cooled down. The polyurethane thus obtained is used, after the solvent has been distilled off, as the resin in the photopolymerizable mixture.

The further processing takes place as described in Examples 1 to 7. The individual data are compiled in Table 3, Examples 27 and 35 being comparative examples.

TABLE 3

| Example No. | Addition to the developer Type | Addition to the developer Quantity, in % by weight | Spraying time, in seconds | Temperature, °C. | Cleaning Solution Constituents | Cleaning Solution Quantity, in % by weight | Cleaning Solution Dipping time, in seconds | Cleaning Solution Temperature, °C. | Adhesion Test a | b | c | d |
|---|---|---|---|---|---|---|---|---|---|---|---|---|
| 27 | — | — | 120 | 23 | $H_3PO_4$ TNG | 8 4 | 130 | 23 | 10 | + | — | — |
| 28 | A | 0.2 | 90 | 25 | — | — | — | — | 0 | — | — | — |
| 29 | — | — | 140 | 25 | $H_2SO_4$ A | 10 5 | 120 | 23 | 1 | — | — | + |
| 30 | — | — | 140 | 25 | $H_3PO_4$ A | 10 5 | 120 | 23 | 0 | — | — | — |
| 31 | — | — | 140 | 25 | $H_3PO_4$ B | 10 2 | 120 | 23 | 3 | — | — | + |
| 32 | A | 0.5 | 90 | 25 | $H_3PO_4$ B | 10 2 | 120 | 23 | 0 | — | — | — |
| 33 | — | — | 120 | 25 | C | 5 | 120 | 23 | 0 | — | — | — |
| 34 | — | — | 120 | 25 | $H_3PO_4$ D | 10 5 | 120 | 23 | 0 | — | — | — |
| 35 | — | — | 120 | 25 | — | — | — | — | 10 | + | — | — |

It will be obvious to those skilled in the art that many modifications may be made within the scope of the present invention without departing from the spirit thereof, and the invention includes all such modifications.

What is claimed is:

1. In the process for the production of a photoresist image, in which a photopolymerizable photoresist layer is applied to a support of copper or a copper alloy, is exposed imagewise and is washed out of the unexposed areas by means of an aqueous-alkaline developer solution, the improvement which comprises treating the surface of the support, after the development as a separate cleaning step, with a solution which contains a water-soluble aliphatic sulfonic acid, or a water-soluble salt of such a sulfonic acid, having 8 to 30 carbon atoms, the photoresist stencil remaining unattacked during this cleaning step.

2. A process as claimed in claim 1 which comprises treating the surface with a solution which contains 0.05 to 15 percent by weight of the sulfonic acid or of the sulfonic acid salt.

3. A process as claimed in claim 1 which comprises treating the surface with a solution of a saturated or mono-unsaturated sulfonic acid or of a salt thereof.

4. A process as claimed in claim 1 which comprises treating the surface with a solution which additionally contains a mineral acid or a water-soluble carboxylic acid.

5. A process as claimed in claim 4 which comprises treating the surface with a solution which contains phosphoric acid as the mineral acid.

6. A process as claimed in claim 1 which comprises treating the surface with a solution which additionally contains a water-miscible organic solvent.

7. A process as claimed in claim 1 which comprises treating the surface with a solution which additionally contains an anti-foaming agent.

8. A process as claimed in claim 1 in which the photopolymerizable photoresist layer includes an adhesion promoter.

9. A process as claimed in claim 1 in which the photopolymerizable photoresist layer is applied to the support by lamination of a prefabricated solid layer.

* * * * *